United States Patent [19]
Jiang

[11] Patent Number: 6,115,398
[45] Date of Patent: Sep. 5, 2000

[54] AUTOMATIC POWER CONTROL OF A SEMICONDUCTOR LASER ARRAY

[75] Inventor: Wenbin Jiang, Phoenix, Ariz.

[73] Assignee: Motorola, Inc., Schaumburg, Ill.

[21] Appl. No.: 09/080,178

[22] Filed: May 18, 1998

[51] Int. Cl.[7] ................ H01S 3/00; H01S 3/04; H01S 5/00

[52] U.S. Cl. ................ 372/43; 372/33; 372/36; 372/50

[58] Field of Search ................ 372/43, 33, 36, 372/50, 19

[56] References Cited

U.S. PATENT DOCUMENTS 5,016,253  5/1991  Kubota ........................ 372/50
5,032,879  7/1991  Buchmann et al. ................ 357/19

*Primary Examiner*—Frank G. Font
*Assistant Examiner*—Armando Rodriguez
*Attorney, Agent, or Firm*—Eugene A. Parsons; William E. Koch

[57] ABSTRACT

Automatic power control (APC) of a semiconductor laser array is achieved by monitoring the backward emission emitted by a plurality of semiconductor devices which compose the semiconductor laser array. The drive signal to the laser is adjusted based on the detected emissions. A photosensor mounted in a submount, to which the semiconductor laser array is mounted, is positioned to receive a photocurrent from the backward emissions. A sweeping injection current across the laser array provides for the sequential detection of the backward emission and thus provides for automatic power control (APC).

20 Claims, 1 Drawing Sheet

AUTOMATIC POWER CONTROL OF A SEMICONDUCTOR LASER ARRAY

FIELD OF THE INVENTION

This invention relates to semiconductor laser devices, and more specifically to monitoring and controlling the operation of the laser devices.

BACKGROUND OF THE INVENTION

Semiconductor lasers, such as edge emitting lasers and vertical cavity surface emitting lasers (VCSELs) are well known, and are formed in a wide variety of configurations. Edge emitting lasers typically consist of an intrinsic junction region formed between two layers of semiconductor material each having been treated with a different type of impurity. When a large electrical current is passed through such a device, laser light emerges from the cleaved facets in the plane of the junction region. VCSELs, on the other hand, typically include an active area disposed or sandwiched between two mirror stacks on a semiconductor substrate. The laser is activated by driving an electrical current through the two mirror stacks and the active area. This is generally accomplished by placing a first electrode across the mirror stack at one end of the laser and a second electrode across the other mirror stack at the other end of the laser. One of the electrodes generally defines a central opening therethrough for the emission of light.

In operation, a threshold level of current must be forced through the active region of the semiconductor laser for lasing to occur. The threshold level is reached when the gain for the stimulated emissions in the cavity equals to or exceeds the loss in the cavity. Upon reaching threshold, the light output rises rapidly with the current, with most of the current resulting in laser emissions.

Edge emitting semiconductor lasers are very sensitive to temperature in output power and threshold current. Most applications involving the use of semiconductor lasers require that the laser output power be stabilized. For example, in the optical data storage application, changes in light intensity of a received signal correspond to the data bits being read. Thus, it is important that the power of the source signal be maintained at a fixed or constant value so that the power of the received data bits corresponds to the actual data rather than the drift of the source signal due to environmental changes.

The power of the source signal may be maintained at a fixed or constant value through Automatic Power Control (APC). APC of semiconductor lasers allows for a constant and consistent output from the lasers. Generally, APC of edge emitting laser devices is easily achieved because edge emitting devices emit light from two ends. APC of edge emitting lasers may be achieved by using one of the light emitting ends to measure the optical power output, which is subsequently used to adjust the electrical power input to the edge emitting device and, thereby, adjusting the optical power output. Typically this is achieved by placing a photosensor behind the laser to receive the backward emission. The power of this backward emission is proportional to the power of the forward emission. Adjustment of the power is achieved by establishing a feedback loop to adjust the laser injection current to maintain a constant forward laser emission power.

While this type of APC works with a single laser, an array of lasers spaced closely apart will experience problems in maintaining the constant power operation for each individual laser due to the overlap in laser emission from the array. More particularly, monitoring of individual lasers which compose the array is performed simultaneously using an array of photosensor, resulting in an overlap in laser emission from the array. For example, a one-dimensional array of four lasers spaced at a maximum of thirty microns apart, will require an array of four photosensors to receive the backward emission from the four lasers. Due to the overlap of the four beams, each photosensor will receive the laser emission from its own corresponding laser, as well as from its neighboring lasers. It is therefore not feasible to use the photocurrent variation of the photosensors to control the corresponding laser output power.

In applications such as parallel optical data storage and parallel laser printing it is necessary or highly desirable to maintain a fixed output power from each laser which composes the array. One solution to the array power monitoring problem is to utilize a single large photosensor to receive the backward laser emission from all four lasers in the array. APC of each individual laser is achieved by controlling the monitor timing during the current sweeping across the four lasers. This technique, while feasible to achieve APC of each individual laser, is difficult to incorporate into the packaging of laser arrays, especially when large laser arrays are used.

Thus, it can be readily seen that conventional APC of laser devices has several disadvantages and problems, thus not easily enabling their manufacture in low cost volume applications and compact packaging. Accordingly, it would be advantageous to have a method and apparatus for controlling the power of semiconductor lasers, particularly edge emitting laser devices, that are reliable, cost efficient, and compatible with standard semiconductor processes.

BRIEF DESCRIPTION OF THE DRAWINGS

The various aspects and embodiments of the present invention will be hereinafter described in reference to the drawing figures, in which like reference characters indicate corresponding elements throughout the several views and in which.

DETAILED DESCRIPTION OF THE PREFERRED EMBODIMENT

Generally, the present invention provides a method and an apparatus for controlling the output power of a plurality of individual lasers in a semiconductor laser array. More particularly, the present invention provides a method for monitoring emissions from an edge emitting laser array and using this information for controlling the output power of the semiconductor laser array. A laterally positioned photosensor, such as a photodiode, controls the power output of the laser array, by monitoring or detecting the back emissions from each of the individual lasers that compose the laser array. The lateral detector generates a photocurrent from the back emissions that is compared to a reference signal. The difference between the photocurrent and reference signal is used to alter the drive signal to the lasers and thereby control the output power of each of the individual lasers, thus the laser array. The photodiode, or photosensor, is integrated into the laser array submount.

Figure 1:
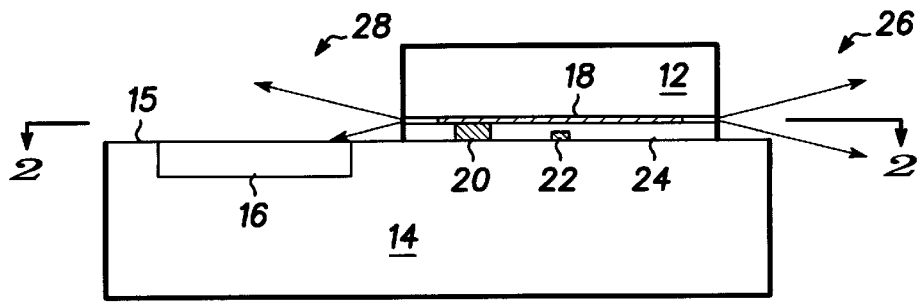
FIG. 1 is a partial cross-sectional view of a semiconductor device submodule in accordance with the present invention.

Turning now to the drawings, attention is first directed to FIG. 1 which illustrates a cross-sectional view of a semiconductor device submodule 10 in accordance with a preferred embodiment of the present invention. Semiconductor device submodule 10 includes a laser array 12, generally composed of a plurality of spaced individual laser devices (not shown). In this particular embodiment, the plurality of laser devices are described as edge emitting lasers. Edge emitting lasers typically consist of an intrinsic junction formed between two layers of semiconductor material each having been treated with a different type of impurity. When a large electrical current is passed through such a device, laser light emerges from the cleaved facets in the plane of the junction region.

Laser array 12 is flip chip bonded to a submount 14. Submount 14 is disclosed as a silicon submount having a plurality of metal contacts (discussed presently) positioned thereon. Submount 14 is typically utilized in the packaging of semiconductors for heat dissipation and handling. In the preferred embodiment, submount 14 is disclosed as utilized for near infrared and visible edge emitting lasers, typically utilized in laser printing and data storage. Alternatively, gallium arsenide (GaAs) is utilized, yet is generally not cost effective. When laser array 12 is designed to include long wavelength lasers, typically 1.3–1.55 microns, as generally utilized in data communications, an indium phosphide (InP) substrate having a indium gallium arsenide phosphide (InGaAsP) epitaxial layer on top for fabrication of the photodetector is utilized for submount 14.

In this particular illustration, a metal contact 18 in electrical cooperation with a metal pad 20 is shown positioned between laser array 12 and submount 14. There is additionally shown an end view of a metal interconnect 22 (discussed presently) having positioned thereon for electrical isolation, a dielectric layer 24. Dielectric layer 24 in this particular embodiment is disclosed as formed of a nitride material, although it should be understood that any similar dielectric material can be included as dielectric layer 24. There is formed within an uppermost 15 surface of submount 14, a photosensor 16, also referred to as a photodiode, photodetector, or the like. During operation laser array 12 emits a forward emission 26 and a back emission 28. By forming photosensor 16 within an uppermost surface 15 of submount 14, backward emission 28 from laser array 12 is able to be monitored for automatic power control (APC).

During operation, by sweeping the injection current across laser array 12, automatic power control (APC) of each individual laser can be achieved. More particularly, photosensor 16 during operation measures a half cone of the backward laser emission from each individual laser in laser array 12. By sweeping the injection current across laser array 12 to achieve automatic power control (APC), the elimination of beam overlap is achieved.

Figure 2:
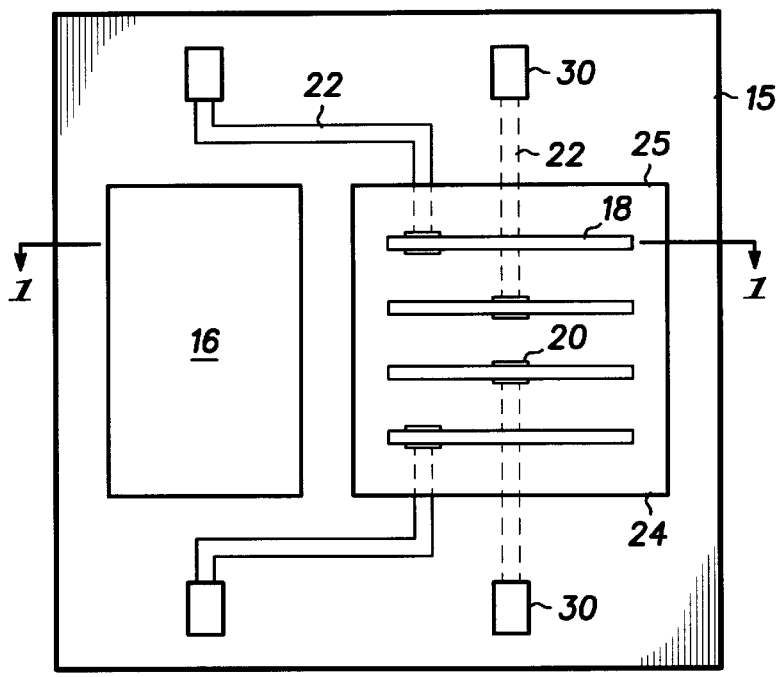
FIG. 2 is a top sectional view taken through line 2—2 of the semiconductor device submodule of FIG. 1.

Referring now to FIG. 2, a top view of semiconductor device submodule 10 is illustrated as taken through line 2—2 of FIG. 1. More particularly, FIG. 2 illustrates a top view of semiconductor device submodule 10 including photosensor 16, a plurality of metal contacts 18 and metal pads 20. In addition, as illustrated, semiconductor device 10 includes a plurality of metal pads 30 positioned about an exterior of submount 14 for wirebonding of semiconductor device 10 to a power supply. Metal contacts 18, metal pads 20, metal interconnects 22, and metal pads 30 are disclosed as composed of a gold (Au) material. It should be understood that while a specific material is disclosed for the formation of metal contacts 18, metal pads 20, metal interconnects 22, and metal pads 30, any material which is sufficiently conductive can be utilized.

As illustrated, during fabrication of semiconductor device 10, submount 14 is provided having integrally formed therein photosensor 16. Metal pads 30 and metal pads 20 are positioned on uppermost surface 15 of submount 14. Metal interconnects 22 are positioned on surface 15 of submount 14, thereby electrically interfacing metal pads 30 and metal contact pads 20. Next, dielectric material layer 24 is deposited on metal pads 20, 30 and interconnects 22. To expose metal contact pads 20, dielectric material layer 24 is etched back, and metal contacts 18 are positioned on an uppermost surface 25 of dielectric material layer 24, so as to be in electrical interface with metal contact pads 20. As a final step in the fabrication of semiconductor device submodule 10, laser array 12 is flip chip bonded to metal contacts 18 and positioned relative to photosensor 16 for automatic power control of laser array 12.

Figure 3:
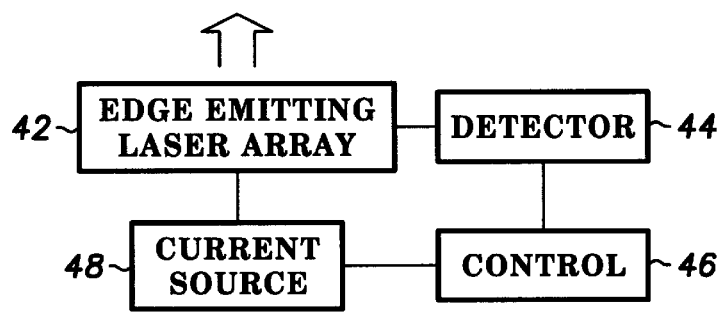
FIG. 3 is a simplified schematic diagram of a feedback control system.

FIG. 3 illustrates a simplified block diagram of a feedback system 40 for controlling the optical output power of laser array 12 of FIGS. 1 and 2. Feedback system 40 controls the output power of each individual laser 42 which composes laser array 12 (as discussed with regard to FIGS. 1 and 2) by monitoring each individual laser device 42 as it is activated by a sweeping current injection. This monitoring allows for detection 44 and thus the control 46 of the drive current 48 provided to each laser device 42 based on measurement taken from the backward emission, or more specifically a feedback signal. More particularly, detector 44, generally similar to photosensor 16 of FIGS. 1 and 2, produces a photocurrent in response to backward emissions from each of the individual laser devices 42. The photocurrent is provided to control device 46. Control device 46 receives and processes the photocurrent signal and regulates the current employed to drive laser devices 42. Particularly, control device 46 provides a feedback signal or correction signal based on the received photocurrent signal to drive current source 48. Drive current source 48 receives the feedback signal and based on the feedback signal, increases or decreases the drive current supplied to laser device 42 which in turn controls the optical output power of laser device 42. This series of steps is repeated as the current is injected to each laser device 42 in the array in a sweeping motion.

Thus, by monitoring the backward emissions in a sweeping motion and adjusting the current provided to drive each individual laser device which composes laser array 12, the optical output power of each laser device in laser array 12 is automatically controlled to the desired optical output power.

By now it should be appreciated that a method and apparatus for automatically controlling the optical output power of a semiconductor laser array has been provided. An advantage of the present invention is that it provides a method and apparatus for controlling the output power of an edge emitting laser array which does not require the positioning of a plurality of individual photosensors each responsible for automatic power control (APC) of the laser to which it is aligned. Using the apparatus and methods of the present invention allows for the automatic power control of an array of lasers utilizing a sweeping current injection. This sweeping current injection allows for an accurate sensing of the emission emitted by each of the plurality of laser devices which compose the laser array by a single photosensing device.

While the present invention has been explained in the context of particular embodiments of semiconductor lasers and the positioning of the photosensor, it should be appreciated that the present invention is not limited to the particular devices as discussed herein. For example, while preferably the photosensor is positioned spaced apart from the laser array, alternatively it could be laterally integrated with the semiconductor laser to minimize the number of steps in the fabrication process.

Various other changes and modifications to the embodiments herein chosen for purposes of illustration will readily occur to those skilled in the art. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A semiconductor device submodule having automatic power control comprising:
    a semiconductor laser array including a plurality of semiconductor laser, the semiconductor laser array characterized as producing a plurality of backward emissions;
    a submount for mounting the semiconductor laser array; and
    a photosensor integrated with the submount for detecting the plurality of backward emissions from the semiconductor laser array.

2. A semiconductor device submodule having automatic power control as claimed in claim 1 wherein the semiconductor laser array includes a plurality of spaced apart edge emitting lasers.

3. A semiconductor device submodule having automatic power control as claimed in claim 1 wherein the semiconductor laser array is flip chip mounted to an uppermost surface of the submount.

4. A semiconductor device submodule having automatic power control as claimed in claim 3 wherein the submount for mounting of the semiconductor laser array is a silicon submount.

5. A semiconductor device submodule having automatic power control as claimed in claim 2 wherein the semiconductor device further includes a plurality of metal contact pads and a plurality of metal interconnects.

6. A light emitting device having automatic power control comprising:
    a semiconductor laser array including a plurality of edge emitting laser devices, each of the plurality of edge emitting laser devices characterized as producing a backward emission;
    a submount for mounting the semiconductor laser array; and
    a photosensor integrated with the submount and positioned for detecting the plurality of backward emissions emitted from the plurality of edge emitting laser devices of the semiconductor laser array.

7. A light emitting device having automatic power control as claimed in claim 6 wherein the submount for mounting the semiconductor laser array includes one of a silicon material, a gallium arsenide material, and an indium phosphide material having an indium gallium arsenide phosphide epitaxial layer deposited thereon.

8. A light emitting device having automatic power control as claimed in claim 6 wherein the semiconductor laser array is flip chip mounted to an uppermost surface of the submount.

9. A light emitting device having automatic power control as claimed in claim 8 wherein the photosensor is mounted within the uppermost surface of the submount.

10. A light emitting device having automatic power control as claimed in claim 8 wherein the photosensor is positioned to receive a half cone of the backward emission from each of the plurality of edge emitting laser devices.

11. A light emitting device having automatic power control as claimed in claim 6 further including a plurality of metal contacts and a plurality of metal interconnects thereby electrically interfacing the semiconductor laser array and the photosensor and providing a means for interfacing the light emitting device to an external power supply.

12. A light emitting device having automatic power control as claimed in claim 11 further including a dielectric material layer characterized as electrically isolating the plurality of metal contacts and the plurality of metal interconnects at cross-over points.

13. A method of controlling the output power of a semiconductor laser array comprising the steps of:
    providing a semiconductor device submodule including an array of semiconductor lasers mounted to a submount having integrated therein a photo sensor;
    injecting in a sweeping motion a current across the array semiconductor lasers thereby sequentially operating a plurality of semiconductor laser devices which compose the array of semiconductor lasers;
    monitoring a backward emission from each of the plurality of semiconductor laser devices which comprise the array of semiconductor lasers;
    generating a feed back signal based on the backward emissions; and
    providing the feed back signal to each of the plurality of semiconductor laser devices to control the output power of each of the semiconductor lasers.

14. A method of controlling the output power of a semiconductor laser array as claimed in claim 13 wherein the plurality of semiconductor laser devices include edge emitting lasers.

15. A method of controlling the output power of a semiconductor laser array as claimed in claim 13 wherein the step of providing a semiconductor device submodule including an array of semiconductor lasers mounted to a submount includes mounting the array of semiconductor lasers to a silicon submount.

16. A method of controlling the output power of a semiconductor laser array comprising the steps of:
    providing a semiconductor device submodule including an array of edge emitting lasers mounted to a submount having integrated therein a photosensor;
    injecting in a sweeping motion a current across the array of edge emitting lasers thereby sequentially operating a plurality of edge emitting lasers which compose the edge emitting laser array;
    monitoring a backward emission from each of the plurality of edge emitting lasers which comprise the edge emitting laser array;
    generating a feed back signal based on the backward emissions; and
    providing the feed back signal to each of the plurality of edge emitting lasers to control the output power of each of the edge emitting lasers.

17. A method of controlling the output power of a semiconductor laser array as claimed in claim 16 wherein the step of providing a semiconductor device submodule including an array of edge emitting lasers mounted to a submount includes providing a silicon submount.

18. A method of controlling the output power of a semiconductor laser array as claimed in claim 17 wherein the step of providing a semiconductor device submodule including an array of edge emitting lasers mounted to a submount having integrated therein a photosensor includes the step of providing a photosensor positioned to receive a half cone of the backward laser emission from each of the plurality of edge emitting laser devices.

19. A method of controlling the output power of a semiconductor laser array as claimed in claim 18 wherein the step of providing a semiconductor device submodule including an array of edge emitting lasers mounted to a submount having integrated therein a photosensor includes the step of mounting the photosensor within an uppermost surface of the submount and interfacing the photosensor and the semiconductor laser array utilizing a plurality of metal pad and metal interconnects.

20. A method of controlling the output power of a semiconductor laser array as claimed in claim 18 wherein the step of monitoring a backward emission from each of the plurality of edge emitting lasers which comprise the edge emitting laser array includes the step of monitoring the half cone of the backward laser emission emitted by each of the plurality of edge emitting lasers.

* * * * *